US011532686B2

(12) United States Patent
Lu et al.

(10) Patent No.: US 11,532,686 B2
(45) Date of Patent: Dec. 20, 2022

(54) ARRAY SUBSTRATE, DISPLAY APPARATUS, AND METHOD OF FABRICATING ARRAY SUBSTRATE

(71) Applicant: BOE Technology Group Co., Ltd., Beijing (CN)

(72) Inventors: Xinhong Lu, Beijing (CN); Ke Wang, Beijing (CN); Hehe Hu, Beijing (CN); Ce Ning, Beijing (CN); Wei Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 888 days.

(21) Appl. No.: 16/330,719

(22) PCT Filed: Sep. 11, 2018

(86) PCT No.: PCT/CN2018/105012
§ 371 (c)(1),
(2) Date: Mar. 5, 2019

(87) PCT Pub. No.: WO2019/169848
PCT Pub. Date: Sep. 12, 2019

(65) Prior Publication Data
US 2021/0359063 A1    Nov. 18, 2021

(30) Foreign Application Priority Data

Mar. 9, 2018 (CN) .......................... 201810194059.7

(51) Int. Cl.
*H01L 29/78* (2006.01)
*H01L 27/32* (2006.01)
*H01L 29/786* (2006.01)

(52) U.S. Cl.
CPC ...... *H01L 27/3272* (2013.01); *H01L 27/3262* (2013.01); *H01L 27/3265* (2013.01);
(Continued)

(58) Field of Classification Search
CPC combination set(s) only.
See application file for complete search history.

(56) References Cited

U.S. PATENT DOCUMENTS

2011/0073918 A1* 3/2011 Makita ............... H01L 27/1277
438/166
2011/0133095 A1* 6/2011 Imai ...................... G01T 1/2018
257/E31.015

(Continued)

FOREIGN PATENT DOCUMENTS

| CN | 106991944 A | 7/2017 |
| CN | 107665909 A | 2/2018 |
| CN | 107731858 A | 2/2018 |

OTHER PUBLICATIONS

International Search Report & Written Opinion dated Dec. 13, 2018, regarding PCT/CN2018/105012.

*Primary Examiner* — Moin M Rahman
(74) *Attorney, Agent, or Firm* — Intellectual Valley Law, P.C.

(57) ABSTRACT

An array substrate includes a base substrate; a first thin film transistor on the base substrate and including a first active layer, a first gate electrode, a first source electrode and a first drain electrode; a second thin film transistor on the base substrate and including a second active layer, a second gate electrode, a second source electrode and a second drain electrode; a first gate insulating layer between the first active layer and the first gate electrode; and a second gate insulating layer between the second active layer and the second gate electrode, the second gate insulating layer being different from the first gate insulating layer. The first source electrode, the first drain electrode, and the second gate electrode are in a same layer. The first source electrode and the first drain electrode are on a side of the second gate insulating layer distal to the base substrate.

17 Claims, 10 Drawing Sheets

(52) U.S. Cl.
CPC .. *H01L 29/78618* (2013.01); *H01L 29/78633* (2013.01); *H01L 29/78645* (2013.01); *H01L 2227/323* (2013.01)

(56) References Cited

U.S. PATENT DOCUMENTS

| | | | |
|---|---|---|---|
| 2017/0092178 A1 | 3/2017 | Lee et al. | |
| 2017/0092198 A1* | 3/2017 | Ryu | G09G 3/3275 |
| 2017/0125733 A1* | 5/2017 | Kwon | H01L 51/5253 |
| 2017/0323936 A1* | 11/2017 | Lee | H01L 27/3265 |
| 2018/0033849 A1 | 2/2018 | Noh et al. | |
| 2018/0175127 A1* | 6/2018 | Lee | H01L 27/3262 |

* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2018/105012, filed Sep. 11, 2018, which claims priority to Chinese Patent Application No. 201810194059.7, filed Mar. 9, 2018, the contents of which are incorporated by reference in the entirety.

TECHNICAL FIELD

The present invention relates to display technology, more particularly, to an array substrate, a display apparatus, and a method of fabricating an array substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides an array substrate comprising a base substrate; a first thin film transistor on the base substrate and comprising a first active layer, a first gate electrode, a first source electrode and a first drain electrode, the first active layer being a silicon active layer; a second thin film transistor on the base substrate and comprising a second active layer, a second gate electrode, a second source electrode and a second drain electrode, the second active layer being a metal oxide active layer; a first gate insulating layer between the first active layer and the first gate electrode; and a second gate insulating layer between the second active layer and the second gate electrode, the second gate insulating layer being different from the first gate insulating layer; wherein the first source electrode, the first drain electrode, and the second gate electrode are in a same layer; and the first source electrode and the first drain electrode are on a side of the second gate insulating layer distal to the base substrate.

Optionally, the second gate insulating layer is in direct contact with the first source electrode and the first drain electrode.

Optionally, the array substrate further comprises an insulating layer on a side of the first gate electrode distal to the base substrate; and a capacitor electrode on a side of the insulating layer distal to the first gate electrode; wherein the capacitor electrode and the first gate electrode constitute a storage capacitor in the first thin film transistor.

Optionally, the insulating layer is in direct contact with the capacitor electrode and the first gate electrode; and the insulating layer has a thickness in a range of approximately 100 nm to approximately 250 nm.

Optionally, the array substrate further comprises a first inter-layer dielectric layer on a side of the capacitor electrode distal to the base substrate; and a buffer layer on a side of the first inter-layer dielectric layer distal to the base substrate.

Optionally, the array substrate further comprises a buffer layer on a side of the capacitor electrode distal to the base substrate; wherein the buffer layer is in direct contact with the second active layer; and at least a sub-layer of the buffer layer that is in direct contact with the second active layer comprises $SiO_x$, $0<x\leq2$.

Optionally, the sub-layer of the buffer layer comprising $SiO_x$ and in direct contact with the second active layer has a thickness greater than approximately 200 nm.

Optionally, the array substrate further comprises an insulating layer on aside of the first gate electrode distal to the base substrate; a first inter-layer dielectric layer on a side of the insulating layer distal to the base substrate; a buffer layer on a side of the first inter-layer dielectric layer distal to the base substrate; and a first via and a second via respectively extending through the second gate insulating layer, the buffer layer, the first inter-layer dielectric layer, and the insulating layer; wherein the first source electrode is electrically connected to the first active layer through the first via; and the first drain electrode is electrically connected to the first active layer through the second via.

Optionally, the array substrate further comprises a second inter-layer dielectric layer on a side of the second gate electrode, the second active layer, the first source electrode, and the first drain electrode distal to the base substrate; wherein the second inter-layer dielectric layer is in direct contact with a source electrode contact part and a drain electrode contact part of the second active layer; and at least a sub-layer of the second inter-layer dielectric layer that is in direct contact with the source electrode contact part and the drain electrode contact part of the second active layer comprises $SiO_x$, $0<x\leq2$.

Optionally, the sub-layer of the second inter-layer dielectric layer comprising $SiO_x$ and in direct contact with the source electrode contact part and the drain electrode contact part of the second active layer has a thickness greater than approximately 200 nm.

Optionally, the array substrate further comprises a passivation layer on a side of the second inter-layer dielectric layer distal to the base substrate; and a third via and a fourth via respectively extending through the passivation layer and the second inter-layer dielectric layer, wherein the second source electrode is electrically connected to the second active layer through the third via; and the second drain electrode is electrically connected to the second active layer through the fourth via.

Optionally, the array substrate further comprises a relay electrode electrically connected to the first drain electrode; and a fifth via extending through the passivation layer and the second inter-layer dielectric layer, wherein the relay electrode, the second source electrode, and the second drain electrode are in a same layer, and on a side of the passivation layer distal to the base substrate; and the relay electrode is electrically connected to the first drain electrode through the fifth via.

Optionally, the array substrate has a display area and a peripheral area; and the first thin film transistor and the second thin film transistor are in the display area; wherein the array substrate in the peripheral area further comprises a signal line layer; a sixth via extending through at least one layer of the array substrate; and an organic filler layer filling the sixth via for enhancing flexibility in the peripheral area; wherein the signal line layer is in a same layer as the relay electrode, the second source electrode, and the second drain electrode; and the signal line layer is on a side of the organic filler layer distal to the base substrate.

Optionally, the array substrate further comprises a light shielding layer configured to shield light from irradiating on the second active layer; wherein the light shielding layer is in a same layer as one of the capacitor electrode and the first gate electrode.

Optionally, the light shielding layer and the second gate electrode constitute a double-gate structure of the second thin film transistor.

Optionally, the second gate insulating layer comprises $SiO_x$, $0<x\leq 2$.

In another aspect, the present invention provides a display apparatus comprising the array substrate described herein or fabricated by a method described herein.

In another aspect, the present invention provides a method of fabricating an array substrate, comprising forming a first thin film transistor on a base substrate, the first thin film transistor formed to comprise a first active layer, a first gate electrode, a first source electrode and a first drain electrode, the first active layer formed as a silicon active layer, forming a second thin film transistor on the base substrate, the second thin film transistor formed to comprise a second active layer, a second gate electrode, a second source electrode and a second drain electrode, the second active layer formed as a metal oxide active layer, forming a first gate insulating layer, the first gate insulating layer formed between the first active layer and the first gate electrode; and forming a second gate insulating layer, the second gate insulating layer formed between the second active layer and the second gate electrode, the second gate insulating layer being different from the first gate insulating layer, wherein the first source electrode, the first drain electrode, and the second gate electrode are formed in a single patterning process using one mask plate; and the first source electrode and the first drain electrode are on formed a side of the second gate insulating layer distal to the base substrate.

Optionally, prior to forming the first source electrode, the first drain electrode, and the second gate electrode in the single patterning process, comprising forming a gate insulating material layer on a side of the second active layer distal to the base substrate, the gate insulating material layer formed to completely cover the second active layer; forming a first via and a second via respectively extending through the gate insulating material layer and other insulating layers between the gate insulating material layer and the first active layer, thereby exposing a source contact region and a drain contact region of the first active layer, and removing residual oxidized silicon on a surface of the first active layer exposed by the first via and the second via using a cleaning agent; wherein the second active layer is fully protected by the gate insulating material layer during a process of removing the residual oxidized silicon on the surface of the first active layer.

Optionally, subsequent to removing the residual oxidized silicon on the surface of the first active layer, comprising forming a conductive material layer on a side of the gate insulating material layer distal to the base substrate; patterning the conductive material layer to using the one mask plate in a single patterning process to form the first source electrode, the first drain electrode, and the second gate electrode; and etching the gate insulating material layer using the first source electrode, the first drain electrode, and the second gate electrode as a mask plate, thereby forming the second gate insulating layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1A:
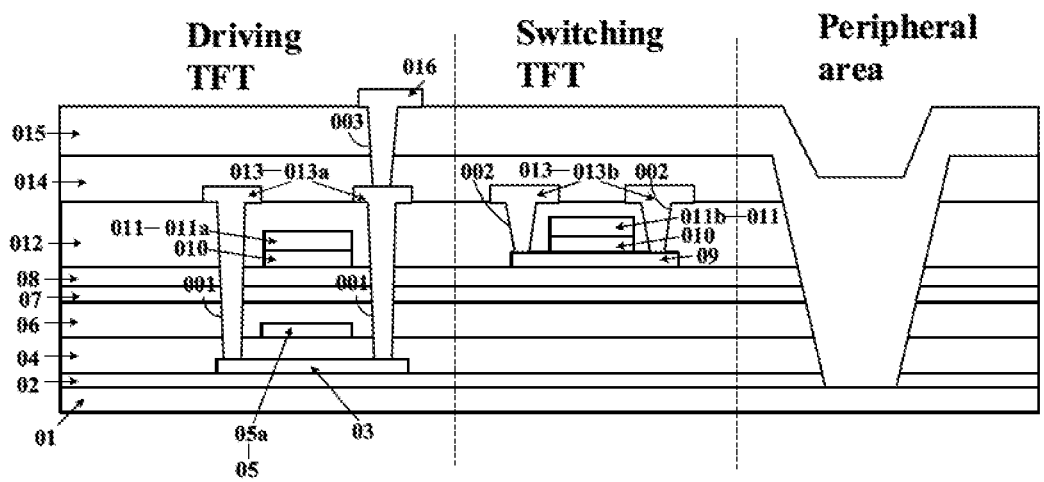
FIG. 1A is a schematic diagram illustrating the structure of an array substrate in some embodiments according to the present disclosure.

FIG. 1A is a schematic diagram illustrating the structure of an array substrate in some embodiments according to the present disclosure. Referring to FIG. 1, the array substrate includes, in a sequential order, a base substrate 01, a first buffer layer 02, a first active layer 03, a first gate insulating layer 04, a first gate electrode layer 05, a second gate insulating layer 06, a first inter-layer dielectric layer 07, a second buffer layer 08, a second active layer 09, a third gate insulating layer 010, a second gate electrode layer 011, a second inter-layer dielectric layer 012, a source-drain electrode layer 013, a passivation layer 014, and a planarization layer 015. The first gate electrode layer 05 includes a first electrode 05a for a driving thin film transistor, driving TFT. The second gate electrode layer 011 includes a second gate electrode 011b for a switching thin film transistor, switching TFT. The source-drain electrode layer 013 includes a first source-drain electrode 013a for the driving TFT, and a second source-drain electrode 013b for the switching TFT. The first electrode 05a, the first source-drain electrode 013a, and the first active layer 03 constitute the driving TFT. The second gate electrode layer 011, the second source-drain electrode 013b, and the second active layer 09 constitute the switching TFT. The first source-drain electrode 013a and the second source-drain electrode 013b are in a same layer and may be patterned in a single patterning process to simplify the fabrication process. The array substrate further includes a capacitor electrode 011a forming a storage capacitance with the first electrode 05a.

Typically, the first active layer 03 of the driving TFT is made of low temperature polysilicon, i.e., the driving TFT is a low temperature polysilicon thin film transistor. Typically, the second active layer 09 of the switching TFT is made of metal oxides, i.e., the switching TFT is a metal oxide thin film transistor.

Figure 1B:
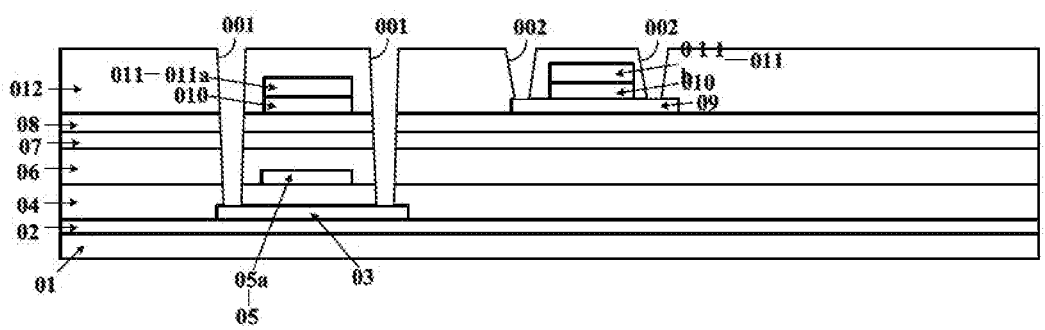
FIG. 1B is a schematic diagram illustrating an intermediate process in fabricating an array substrate in some embodiments according to the present disclosure.

In the present disclosure, it is discovered that several issues exist in the array substrate as shown in FIG. 1A. FIG. 1B is a schematic diagram illustrating an intermediate process in fabricating an array substrate in some embodiments according to the present disclosure. Referring to FIG. 1A and FIG. 1B, because the first source-drain electrode 013a and the second source-drain electrode 013b are formed in a single patterning process, it is required to form vias 001 for the first source-drain electrode 013a and vias 002 for the second source-drain electrode 013b, so that the first source-drain electrode 013a can be connected to the first active layer 03 and the second source-drain electrode 013b can be connected to the second active layer 09. Accordingly, the vias 001 must have a sufficiently large depth for making the above-mentioned electrical connection, demanding a complicated etching process. Often times, etching of the layers of the array substrate during the process of forming the vias 001 and 002 inadvertently affects the integrity of the second active layer 09. These issues often result in malfunctions of the thin film transistor.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a base substrate; a first thin film transistor on the base substrate and including a first active layer, a first gate electrode, a first source electrode and a first drain electrode, the first active layer being a silicon active layer; a second thin film transistor on the base substrate and including a second active layer, a second gate electrode, a second source electrode and a second drain electrode, the second active layer being a metal oxide active layer; a first gate insulating layer between the first active layer and the first gate electrode; and a second gate insulating layer between the second active layer and the second gate electrode, the second gate insulating layer being different from the first gate insulating layer. In the present array substrate, the first source electrode, the first drain electrode, and the second gate electrode are in a same layer. Optionally, the first source electrode and the first drain electrode are on a side of the second gate insulating layer distal to the base substrate.

As used herein, the term "same layer" refers to the relationship between the layers simultaneously formed in the same step. In one example, the first source electrode, the first drain electrode, and the second gate electrode are in a same layer when they are formed as a result of one more steps of a single patterning process performed in a same layer of material. In another example, the first source electrode, the first drain electrode, and the second gate electrode can be formed in a same layer by simultaneously performing the step of forming the first source electrode, the step of forming the first drain electrode, and the step of forming the second gate electrode. The term "same layer" does not always mean that the thickness of the layer or the height of the layer in a cross-sectional view is the same.

Figure 2:
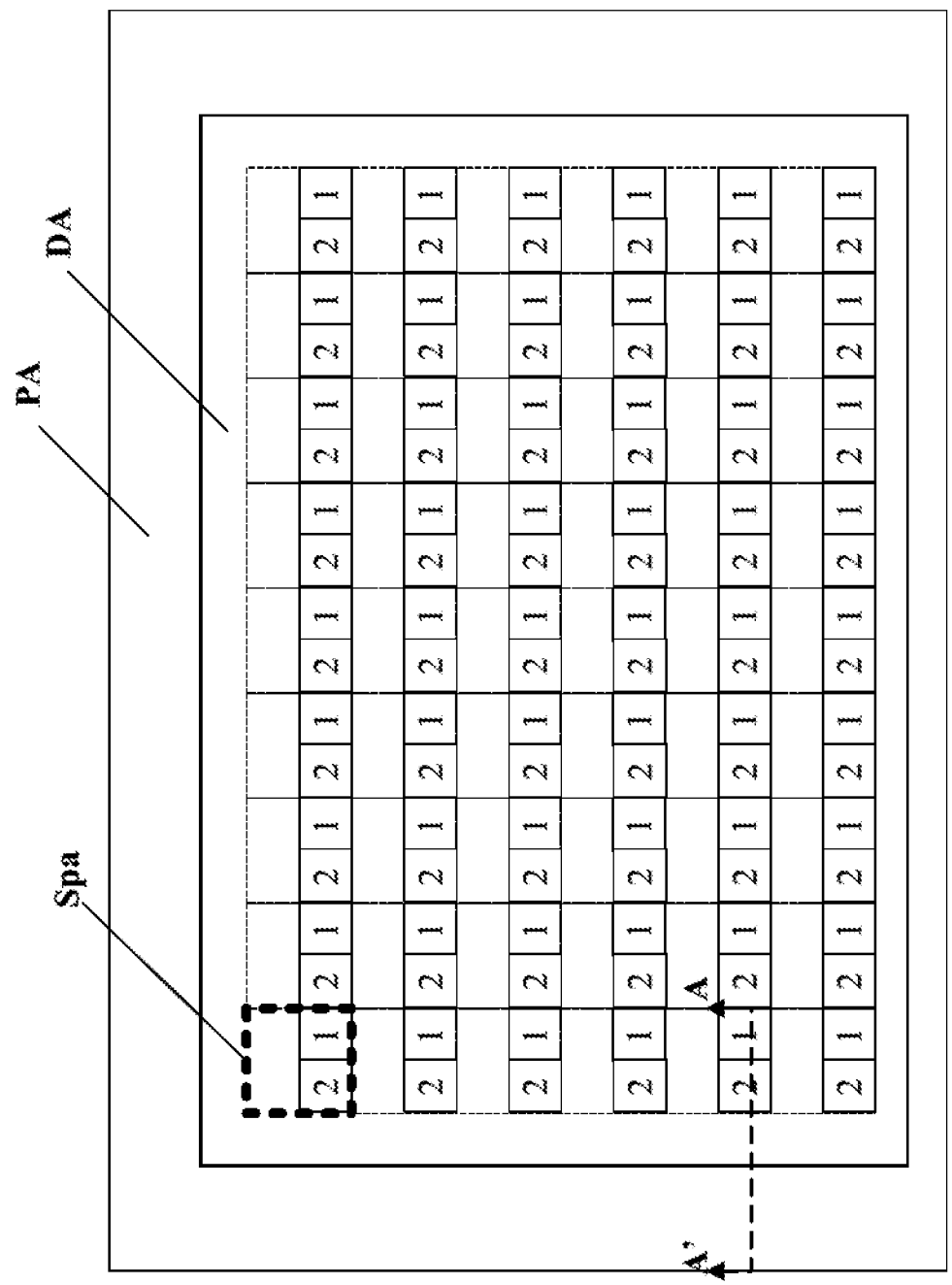
FIG. 2 is a schematic diagram illustrating the structure of an array substrate in some embodiments according to the present disclosure.

FIG. 2 is a schematic diagram illustrating the structure of an array substrate in some embodiments according to the present disclosure. Referring to FIG. 2, the array substrate in some embodiments includes multiple ones of a first thin film transistor 1 and multiple ones of a second thin film transistor 2, both of which in the display area DA. Optionally, the first thin film transistor 1 is a thin film transistor having a silicon active layer, e.g., a polycrystalline silicon active layer. Optionally, the second thin film transistor 2 is a thin film transistor having a metal oxide active layer, e.g., an indium tin oxide active layer. In one example, the array substrate includes an array of a matrix of a plurality of subpixels Spa, each of which includes at least one of the first thin film transistor 1 and at least one of the second thin film transistor 2. Optionally, the array substrate is an organic light emitting diode array substrate. Optionally, the first thin film transistor 1 is a driving thin film transistor (e.g., a transistor connected to a power supply line and to a light emitting diode) in an organic light emitting diode array substrate. Optionally, the second thin film transistor 2 is a switching thin film transistors (e.g., a transistor connected to a data line and the gate electrode of the driving transistor, i.e., an address selection thin film transistor) in an organic light emitting diode array substrate.

As used herein the term "peripheral area" refers to an area where various circuits and wires are provided to transmit signals to the array substrate. To increase the transparency of the display apparatus, non-transparent or opaque components of the display apparatus (e.g., battery, printed circuit board, metal frame), can be disposed in the peripheral area rather than in the display areas. As used herein, the term "display area" refers to an area of the array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display. An inter-subpixel region refers to a region between adjacent subpixel regions, such as a region corresponding to a black matrix in a liquid crystal display or a region corresponding a pixel definition layer in an organic light emitting diode display. Optionally, the inter-subpixel region is a region between adjacent subpixel regions in a same pixel. Optionally, the inter-subpixel region is a region between two adjacent subpixel regions from two adjacent pixels.

Figure 3:
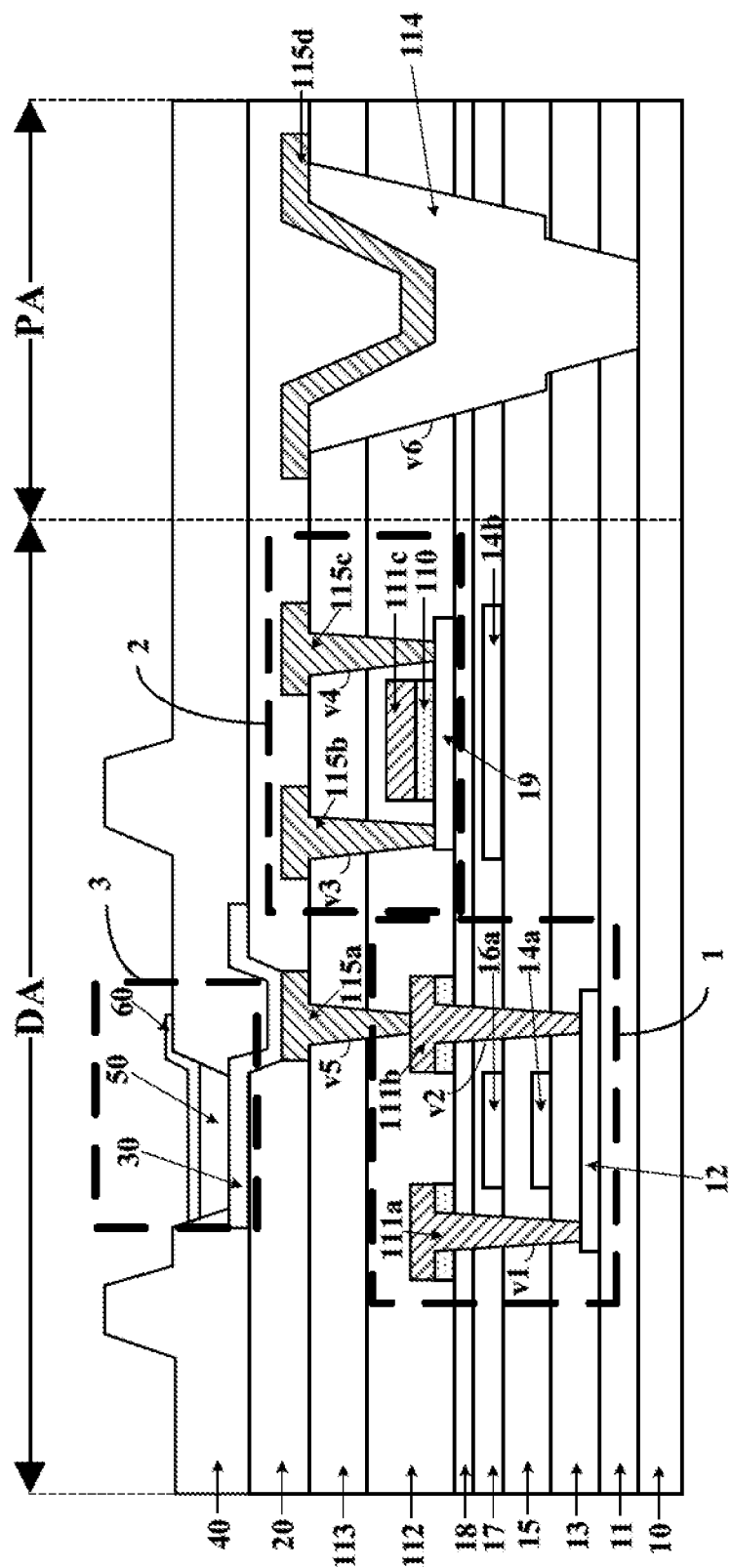
FIG. 3 is a cross-sectional view along line A-A' in the array substrate of FIG. 2.

FIG. 3 is a cross-sectional view along line A-A' in the array substrate of FIG. 2. Referring to FIG. 3, the army substrate in some embodiments includes a base substrate 10, a second buffer layer 11 on the base substrate 10, a first thin film transistor 1 and a second thin film transistor 2 on a side of the first buffer layer 11 distal to the base substrate 10, the first thin film transistor 1 and the second thin film transistor 2 being in the display area DA, an organic filer layer 114 on a side of the first buffer layer 11 distal to the base substrate 10, a signal line 115d on a side of the organic filler layer 114 distal to the base substrate 10, a planarization layer 20 on a side of the signal line, the first thin film transistor 1, and the second thin film transistor 2 distal to the base substrate 10, and a light emitting element 3 on a side of the planarization layer 20 distal to the base substrate 10. The first thin film transistor 1, and the second thin film transistor 2, and the light emitting element 3 are in the display area DA. The signal line 115d and the organic filler layer 114 are in the peripheral area PA.

The first thin film transistor 1 includes a first active layer 12, a first gate electrode 14a, a first source electrode 111a, and a first drain electrode 111b. Optionally, the first active layer 12 is a silicon active layer, e.g., a polycrystalline silicon active layer. The second thin film transistor 2 includes a second active layer 19, a second gate electrode 111c, a second source electrode 115b, and a second drain electrode 115c. Optionally, the second active layer 19 is a metal oxide active layer, e.g., an indium tin oxide active layer. The light emitting element 3 in some embodiments includes a first electrode 30, a second electrode 60, and a light emitting layer 50 between the first electrode 30 and the second electrode 60. Various appropriate light emitting elements may be used in the present display substrate. Examples of appropriate light emitting elements include an organic light emitting diode, a quantum dots light emitting diode, and a micro light emitting diode.

In some embodiments, the array substrate further includes a first gate insulating layer 13 between the first active layer 12 and the first gate electrode 14a, and a second gate insulating layer 110 between the second active layer 19 and the second gate electrode 111c, the second gate insulating layer 110 being different from the first gate insulating layer 13.

In some embodiments, the first source electrode 111a, the first drain electrode 11b, and the second gate electrode 111c are in a same layer. Optionally, the first source electrode 111a and the first drain electrode 111b are on a side of the second gate insulating layer 110 distal to the base substrate 10. In one example, the second gate insulating layer 110 is in direct contact with the first source electrode 111a and the first drain electrode 111b. In some embodiments, the second source electrode 115b and a second drain electrode 115c are in a same layer.

In some embodiments, the second gate insulating layer 110 includes $SiO_x$, $0<x\leq2$. In one example, the second gate insulating layer 110 is made of silicon dioxide, $SiO_2$. To protect the second active layer 19 during a cleaning step in the fabricating process, the second gate insulating layer 110 is made to have a thickness sufficiently large to withstand the etching of the cleaning solution. Optionally, the second gate insulating layer 110 has a thickness in a range of approximately 50 nm to approximately 200 nm, e.g., approximately 50 nm to approximately 100 nm, approximately 100 nm to approximately 150 nm, approximately 150 am to approximately 200 nm.

In some embodiments, the array substrate further includes a capacitor electrode 16a. Referring to FIG. 3, the capacitor electrode 16a and the first gate electrode 14a constitute a storage capacitor in the first thin film transistor 1. Specifically, the array substrate further includes an insulating layer 15 on a side of the first gate electrode 14a distal to the base substrate 10, the capacitor electrode 16a is on a side of the insulating layer 15 distal to the first gate electrode 14a. Optionally, the insulating layer 15 has a single-layer structure, e.g., consisting of only a single layer.

In some embodiments, the array substrate further includes a light shielding layer 14b configured to shield light from irradiating on the second active layer 19. Referring to FIG. 3, an orthographic projection of the light shielding layer 14b on the base substrate 10 in some embodiments substantially covers an orthographic projection of the second active layer 19. Optionally, the capacitor electrode 16a and the light shielding layer 14b are in a same layer and can be fabricated in a single patterning process using a single mask plate. Optionally, the light shielding layer 14b and the second gate electrode 111c constitute a double-gate structure of the second thin film transistor 2.

In some embodiments, the insulating layer 15 is in direct contact with the first capacitor electrode 16a and the first gate electrode 14a, and in direct contact with the first gate insulating layer 13 in regions outside the first gate electrode 14a. Optionally, the insulating layer 15 has a thickness in a range of approximately 100 nm to approximately 250 nm, e.g., approximately 100 nm to approximately 150 nm, approximately 150 nm to approximately 200 nm, and approximately 200 nm to approximately 250 nm.

In some embodiments, the array substrate further includes a first inter-layer dielectric layer 17 on a side of the first capacitor electrode 16a distal to the base substrate 10. Optionally, the array substrate further includes a second buffer layer 18 on a side of the first inter-layer dielectric layer 17 distal to the base substrate 10.

In some embodiments, the array substrate further includes a second buffer layer 18 on a side of the first capacitor electrode 16a distal to the base substrate 10. Optionally, referring to FIG. 3, the second buffer layer 18 is in direct contact with the second active layer 19. The second buffer layer 18 may have a single layer structure. Optionally, the second buffer layer 18 includes a plurality of sublayers. Each sub-layer includes an insulating material such as silicon oxide ($SiO_x$), silicon nitride ($SiN_y$, e.g., $Si_3N_4$), and silicon oxynitride (SiOxNy). Optionally, at least a sub-layer of the second buffer layer 18 that is in direct contact with the second active layer 19 includes $SiO_x$, $0<x\leq2$, e.g., silicon dioxide. Optionally, the sub-layer of the second buffer layer 18 including $SiO_x$ and in direct contact with the second active layer 19 has a thickness greater than approximately 200 nm, e.g., greater than approximately 250 nm, greater than approximately 300 nm, and greater than approximately 350 nm.

Referring to FIG. 3, in some embodiments, the array substrate includes an insulating layer 15 on a side of the first gate electrode 14a distal to the base substrate 10, a first inter-layer dielectric layer 17 on a side of the insulating layer 15 distal to the base substrate 10, a second buffer layer 18 on a side of the first inter-layer dielectric layer 17 distal to the base substrate 10. The array substrate further includes a first via v1 and a second via v2 extending through the second gate insulating layer 110, the second buffer layer 18, the first inter-layer dielectric layer 17, and the insulating layer 15. The first source electrode 111a is electrically connected to the first active layer 12 through the first via v1. The first drain electrode 111b is electrically connected to the first active layer 12 through the second via v2.

In some embodiments, on a side of the second gate electrode 111c, the second active layer 19, the first source electrode 111a, and the first drain electrode 111b distal to the base substrate 10, the array substrate further includes a second inter-layer dielectric layer 112. Optionally, the second inter-layer dielectric layer 112 is in direct contact with a source electrode contact part and a drain electrode contact part of the second active layer 19. The second inter-layer dielectric layer 112 may have a single layer structure. Optionally, the second inter-layer dielectric layer 112 includes a plurality of sublayers. Each sub-layer includes an insulating material such as silicon oxide ($SiO_x$), silicon nitride ($SiN_y$, e.g., $Si_3N_4$), and silicon oxynitride ($SiO_xN_y$). Optionally, at least a sub-layer of the second inter-layer dielectric layer 112 that is in direct contact with the source electrode contact part and the drain electrode contact part of the second active layer 19 includes $SiO_x$, $0<x\leq2$, e.g., silicon dioxide. Optionally, the sub-layer of the second inter-layer dielectric layer 112 including $SiO_x$ and in direct contact with the source electrode contact part and the drain electrode contact part of the second active layer 19 has a thickness greater than approximately 200 nm, e.g., greater than approximately 250 nm, greater than approximately 300 nm, and greater than approximately 350 nm.

In some embodiments, on aside of the second inter-layer dielectric layer 112 distal to the base substrate 10, the array substrate further includes a passivation layer 113. The array substrate further includes a third via v3 and a fourth via v4 respectively extending through the passivation layer 113 and the second inter-layer dielectric layer 112. The second source electrode 115b is electrically connected to the second active layer 19 through the third via v3. The second drain electrode 115c is electrically connected to the second active layer 19 through the fourth via v4.

In some embodiments, referring to FIG. 3, the array substrate further includes a relay electrode 115a electrically connected to the first drain electrode 111b. The array substrate in some embodiments includes a fifth via v5 extending through the passivation layer 113 and the second inter-layer dielectric layer 112. The relay electrode 115a is electrically connected to the first drain electrode 111b through the fifth via v5. As shown in FIG. 3, the relay electrode 115a electrically connects the first drain electrode 111b to a light emitting element 3. For example, the relay electrode 115a electrically connects a first electrode 30 of the light emitting element 3 to the first drain electrode 111b. The voltage provided from the first drain electrode 111b through the relay electrode 115a to the first electrode 30 for driving light emission in the light emitting element 3.

In some embodiments, the relay electrode 11a, the second source electrode 115b, and the second drain electrode 115c are all on a side of the passivation layer 113 distal to the base substrate 10. Optionally, the relay electrode 115a, the second source electrode 115b, and the second drain electrode 115c are in a same layer.

In some embodiments, referring to FIG. 3, the array substrate further includes a planarization layer 20 on a side of the relay electrode 115a, the second source electrode 115b, the second drain electrode 115c distal to the passivation layer 113.

In some embodiments, in the peripheral area PA, the array substrate further includes a signal line layer 115d, and an organic filler layer 114 for enhancing flexibility in the peripheral area PA. Specifically, the array substrate includes a sixth via v6 extending through at least one layer of the array substrate, and the organic filler layer 114 filling the sixth via v6. In one example, the six via v6 extends through the passivation layer 113, the second inter-layer dielectric layer 112, the second buffer layer 18, the first inter-layer dielectric layer 17, the insulating layer 15, the first gate insulating layer 13, and the first buffer layer 11 in the peripheral area PA. Optionally, the organic filler layer 114 is limited to the peripheral area PA, and does not extend into the display area DA.

In some embodiments, referring to FIG. 3, the signal line layer 115d is on aside of the organic filler layer 114 distal to the base substrate 10. Optionally, the planarization layer 20 is on a side of the signal line layer 115d, the relay electrode 115a, the second source electrode 115b, and the second drain electrode 115c distal to the base substrate 10. Optionally, the relay electrode 115a, the second source electrode 115b, the second drain electrode 115c, and the signal line layer 115d are in a same layer.

In some embodiments, referring to FIG. 3, the array substrate further includes a pixel definition layer 40 for defining a pixel aperture for the light emitting element 3. The pixel definition layer 40 is on a side of the planarization layer 20 distal to the base substrate 10.

Optionally, the first thin film transistor 1 is a top gate-type thin film transistor (as shown in FIG. 3). Optionally, the first thin film transistor 1 is a bottom gate-type thin film transistor. Optionally, the second thin film transistor 2 is a top gate-type thin film transistor (as shown in FIG. 3). Optionally, the second thin film transistor 2 is a bottom gate-type thin film transistor.

In another aspect, the present disclosure provides a method of fabricating an array substrate having a display area and a peripheral area. In some embodiments, the method includes forming multiple ones of a first thin film transistor and multiple ones of a second thin film transistor in the display area. Optionally, the first thin film transistor is formed to have a silicon active layer, e.g., a polycrystalline silicon active layer. Optionally, the second thin film transistor is formed to have a metal oxide active layer, e.g., an indium tin oxide active layer. In one example, the army substrate is formed to include an array of a matrix of a plurality of subpixels Spa, each of which is formed to include at least one of the first thin film transistor and at least one of the second thin film transistor.

Figure 4:
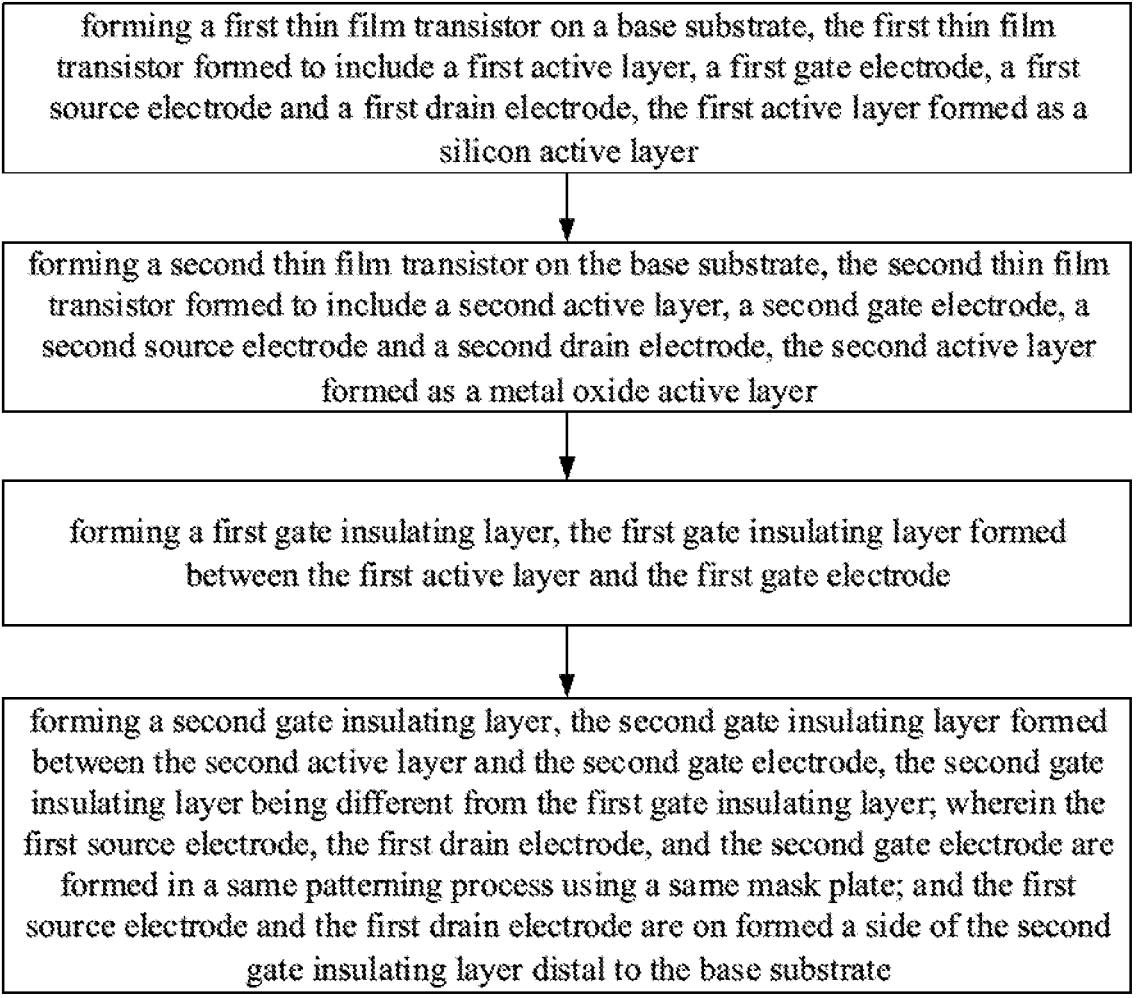
FIG. 4 is a flow chart illustrating a method of fabricating an array substrate in some embodiments according to the present disclosure.

FIG. 4 is a flow chart illustrating a method of fabricating an array substrate in some embodiments according to the present disclosure. Referring to FIG. 4, the method in some embodiments includes forming a first thin film transistor on a base substrate, the first thin film transistor formed to include a first active layer, a first gate electrode, a first source electrode and a first drain electrode, the first active layer formed as a silicon active layer, forming a second thin film transistor on the base substrate, the second thin film transistor formed to include a second active layer, a second gate electrode, a second source electrode and a second drain electrode, the second active layer formed as a metal oxide active layer; forming a first gate insulating layer, the first gate insulating layer formed between the first active layer and the first gate electrode; and forming a second gate insulating layer, the second gate insulating layer formed between the second active layer and the second gate electrode, the second gate insulating layer being different from the first gate insulating layer. Optionally, the first source electrode, the first drain electrode, and the second gate electrode are formed in a single patterning process using one mask plate. Optionally, the first source electrode and the first drain electrode are on formed a side of the second gate insulating layer distal to the base substrate.

Optionally, the second gate insulating layer is formed to be in direct contact with the first source electrode and the first drain electrode. Optionally, the second gate insulating layer is formed to have a thickness in a range of approximately 50 nm to approximately 200 nm. Optionally, the second gate insulating layer is formed using $SiO_x$, $0<x\leq 2$.

In some embodiments, the method further includes forming an insulating layer on a side of the first gate electrode distal to the base substrate; and forming a first capacitor electrode on a side of the insulating layer distal to the first gate electrode. The first capacitor electrode and the first gate electrode constitute a first storage capacitor in the first thin film transistor. Optionally, the insulating layer is formed to be in direct contact with the first capacitor electrode and the first gate electrode. Optionally, the insulating layer is formed to have a thickness in a range of approximately 100 nm to approximately 250 nm.

In some embodiments, the method further includes forming a first inter-layer dielectric layer on a side of the first capacitor electrode distal to the base substrate. Optionally, the method further includes forming a buffer layer on a side of the first inter-layer dielectric layer distal to the base substrate.

In some embodiments, the method further includes forming a buffer layer on a side of the first capacitor electrode distal to the base substrate. Optionally, the buffer layer is formed to be in direct contact with the second active layer. Optionally, at least a sub-layer of the buffer layer that is in direct contact with the second active layer is formed using SiO$_x$, 0<x≤2. Optionally, the sub-layer of the buffer layer comprising SiO$_x$ and in direct contact with the second active layer is formed to have a thickness greater than approximately 200 nm.

In some embodiments, the method further includes forming an insulating layer on a side of the first gate electrode distal to the base substrate; forming a first inter-layer dielectric layer on a side of the insulating layer distal to the base substrate; forming a buffer layer on a side of the first inter-layer dielectric layer distal to the base substrate; and forming a first via and a second via respectively extending through the second gate insulating layer, the buffer layer, the first inter-layer dielectric layer, and the insulating layer. Optionally, the first source electrode is formed to be electrically connected to the first active layer through the first via. Optionally, the first drain electrode is formed to be electrically connected to the first active layer through the second via.

In some embodiments, the method further includes forming a second inter-layer dielectric layer on a side of the second gate electrode, the second active layer, the first source electrode, and the first drain electrode distal to the base substrate. Optionally, the second inter-layer dielectric layer is formed to be in direct contact with a source electrode contact part and a drain electrode contact part of the second active layer. Optionally, at least a sub-layer of the second inter-layer dielectric layer that is in direct contact with the source electrode contact part and the drain electrode contact part of the second active layer is formed using SiO$_x$, 0<x≤2. Optionally, the sub-layer of the second inter-layer dielectric layer made of SiO$_x$ and in direct contact with the source electrode contact part and the drain electrode contact part of the second active layer is formed to have a thickness greater than approximately 200 nm.

In some embodiments, the method further includes forming a passivation layer on a side of the second inter-layer dielectric layer distal to the base substrate. Optionally, the method further includes forming a third via and a fourth via respectively extending through the passivation layer and the second inter-layer dielectric layer. Optionally, the second source electrode is formed to be electrically connected to the second active layer through the third via. Optionally, the second drain electrode is formed to be electrically connected to the second active layer through the fourth via.

In some embodiments, the method further includes forming a relay electrode electrically connected to the first drain electrode; and forming a fifth via extending through the passivation layer and the second inter-layer dielectric layer. Optionally, the relay electrode, the second source electrode, and the second drain electrode are formed in a same layer in a single patterning step using a single mask plate, and optionally using a same material. Optionally, the relay electrode, the second source electrode, and the second drain electrode are formed on a side of the passivation layer distal to the base substrate. Optionally, the relay electrode is formed to be electrically connected to the first drain electrode through the fifth via.

In some embodiments, the method further includes forming a planarization layer on a side of the relay electrode, the second source electrode, the second drain electrode distal to the passivation layer.

In some embodiments, the method further includes, in the peripheral area, forming a signal line layer, forming a sixth via extending through at least one layer of the array substrate; and forming an organic filler layer filling the sixth via for enhancing flexibility in the peripheral area. Optionally, the signal line layer is formed in a same layer as the relay electrode, the second source electrode, and the second drain electrode, e.g., in a single patterning step using a single mask plate and optionally using a same material. Optionally, the signal line layer is formed on a side of the organic filler layer distal to the base substrate. Optionally, the planarization layer is formed on a side of the relay electrode, the second source electrode, the second drain electrode, and the signal line layer distal to the base substrate.

In some embodiments, the method further includes forming a light emitting element. Optionally, the step of forming the light emitting element includes forming a first electrode, forming a light emitting layer, and forming a second electrode. The light emitting element is formed between the first electrode and the second electrode. Optionally, the first electrode is formed to be electrically connected to the relay electrode.

Figure 5A:
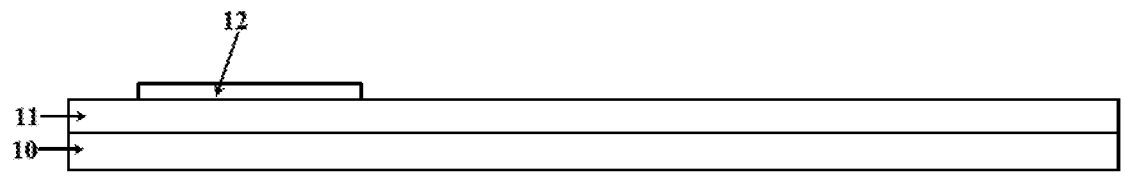
FIGS. 5A to 5Q illustrate a process of fabricating an array substrate in some embodiments according to the present disclosure.
Figure 5B:
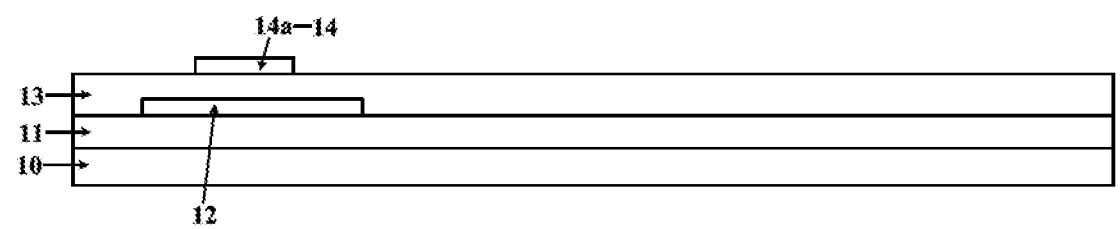
Figure 5C:
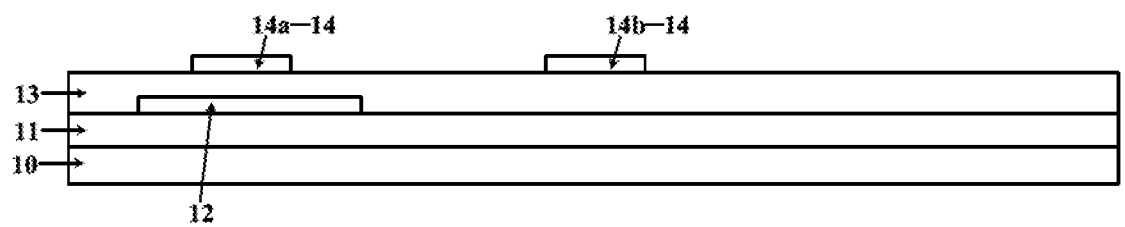
Figure 5D:
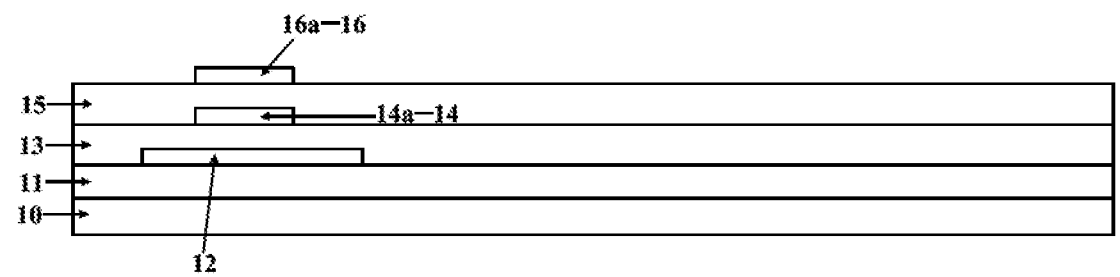
Figure 5E:
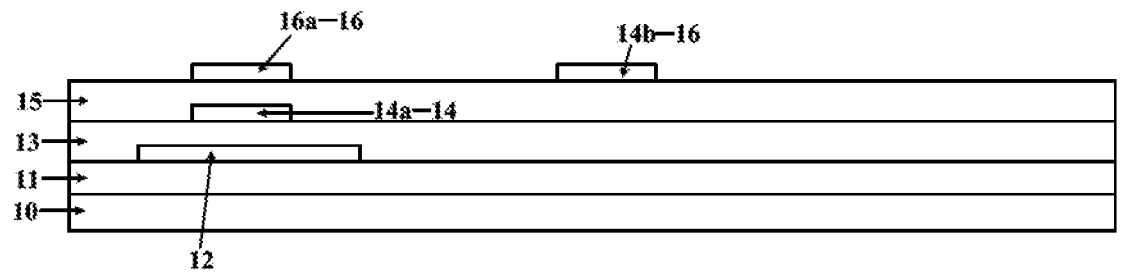
Figure 5F:
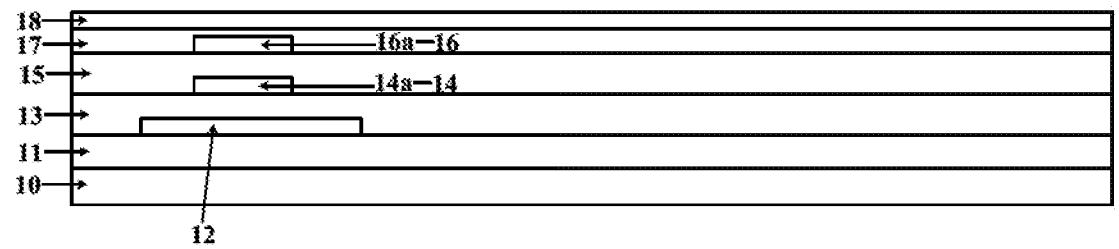
Figure 5G:
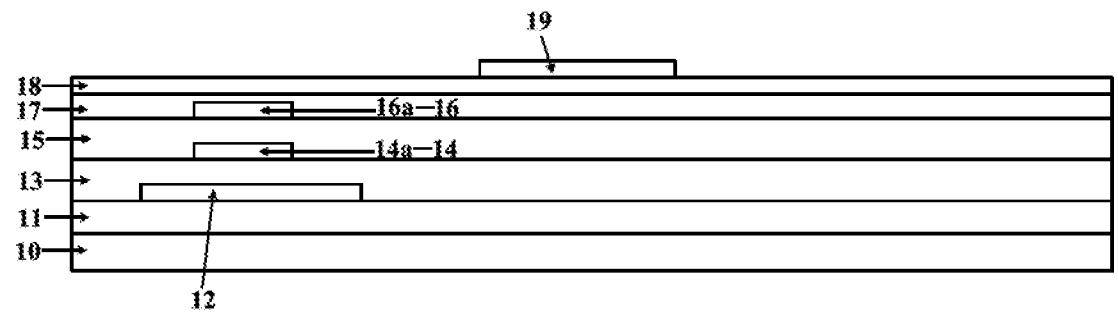
Figure 5H:
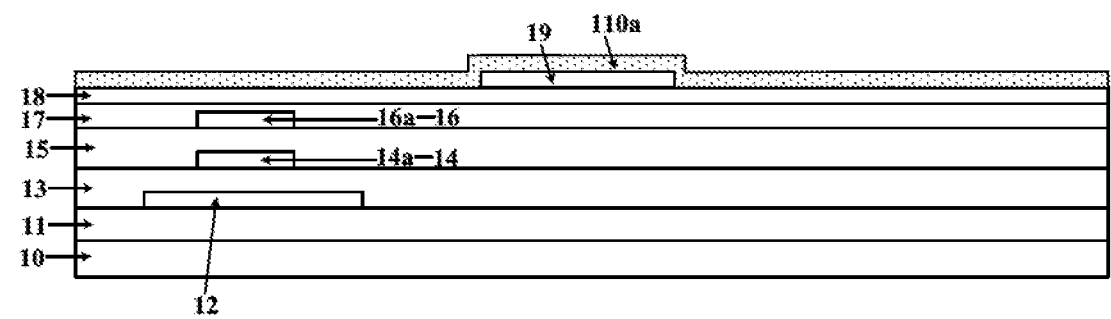
Figure 5I:
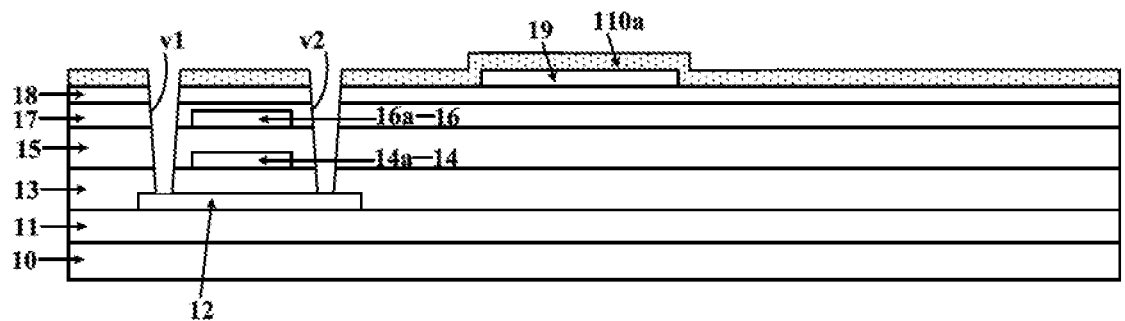
Figure 5J:
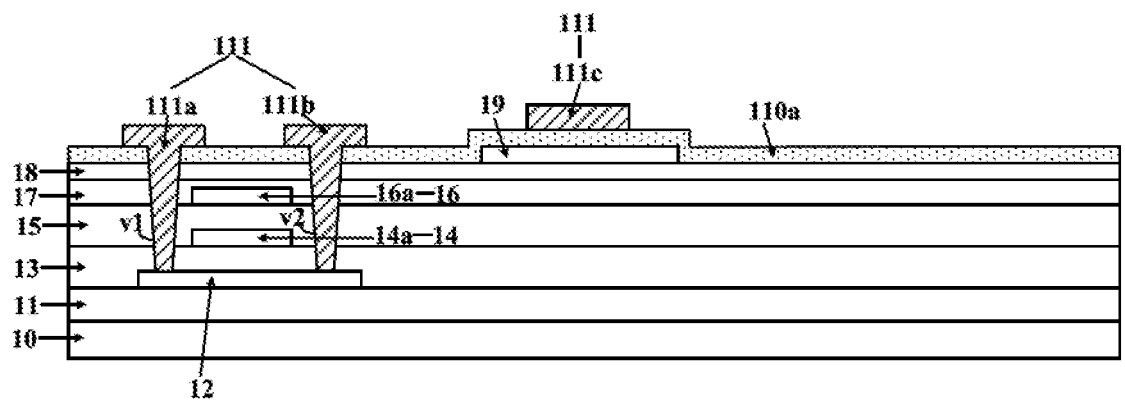
Figure 5K:
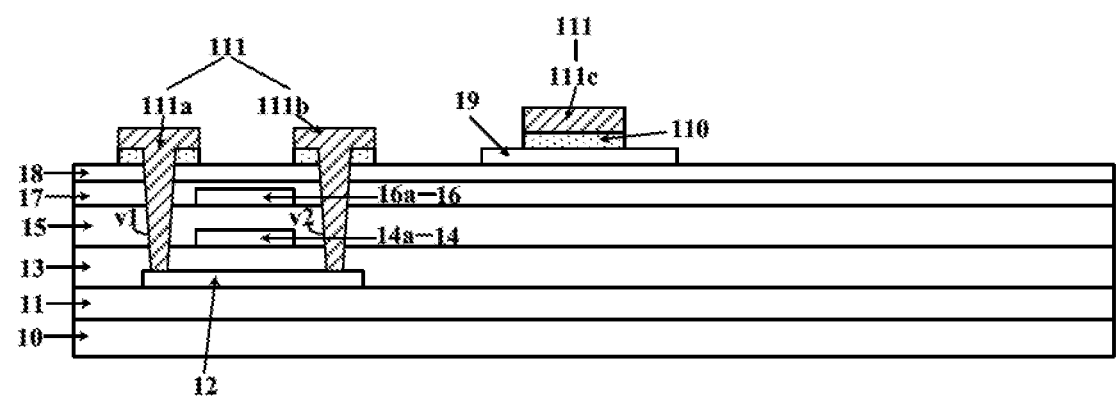
Figure 5L:
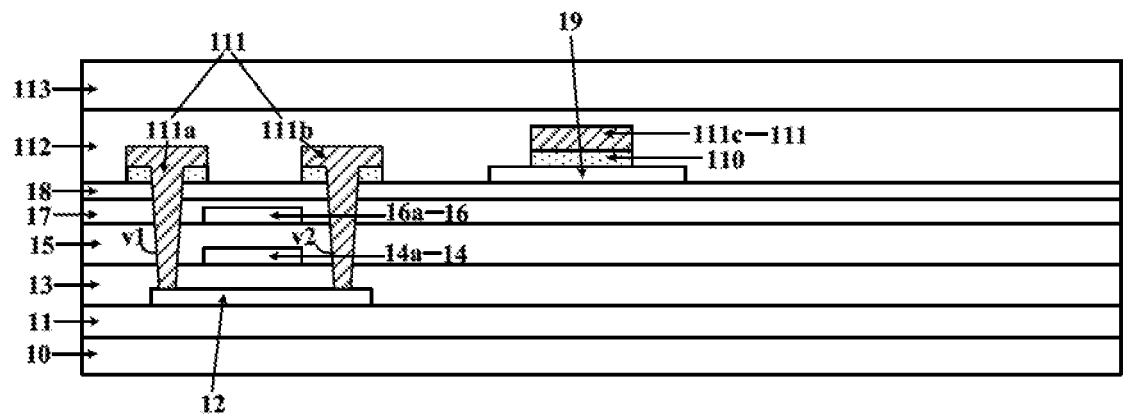
Figure 5M:
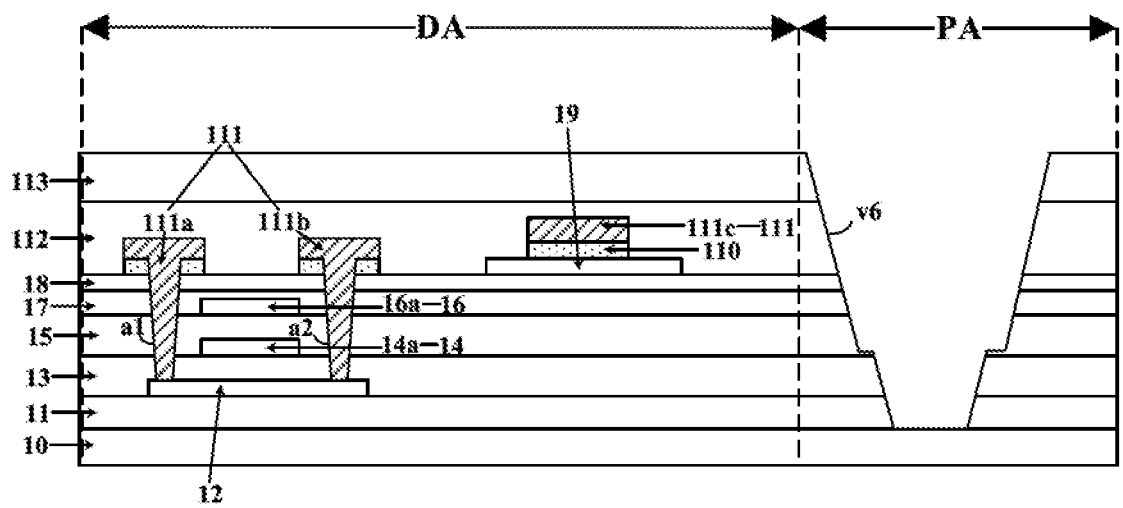
Figure 5N:
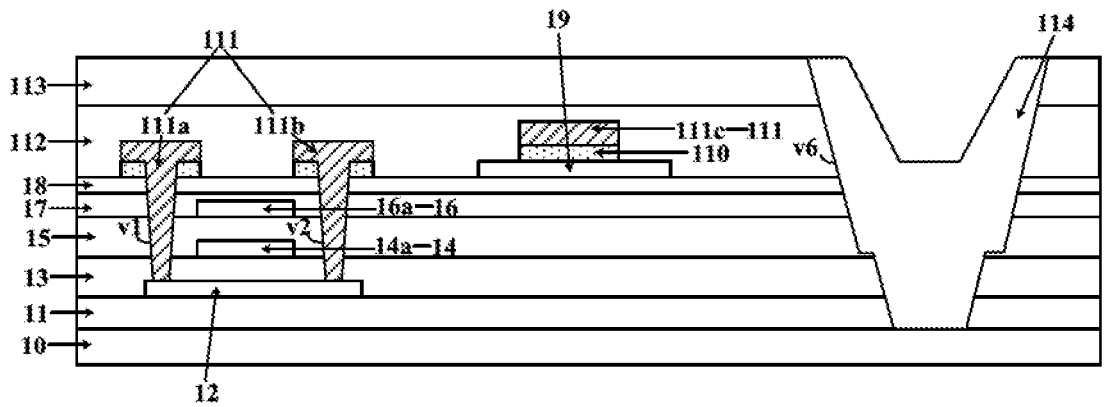
Figure 5O:
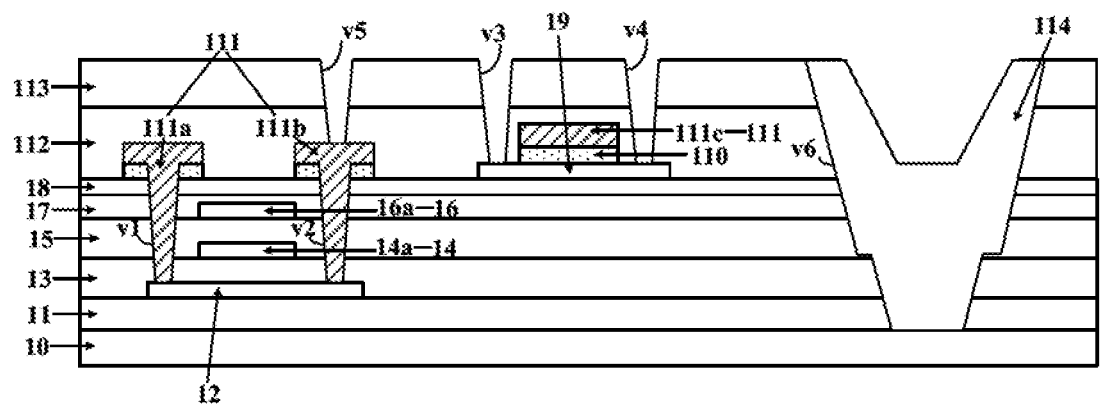
Figure 5P:
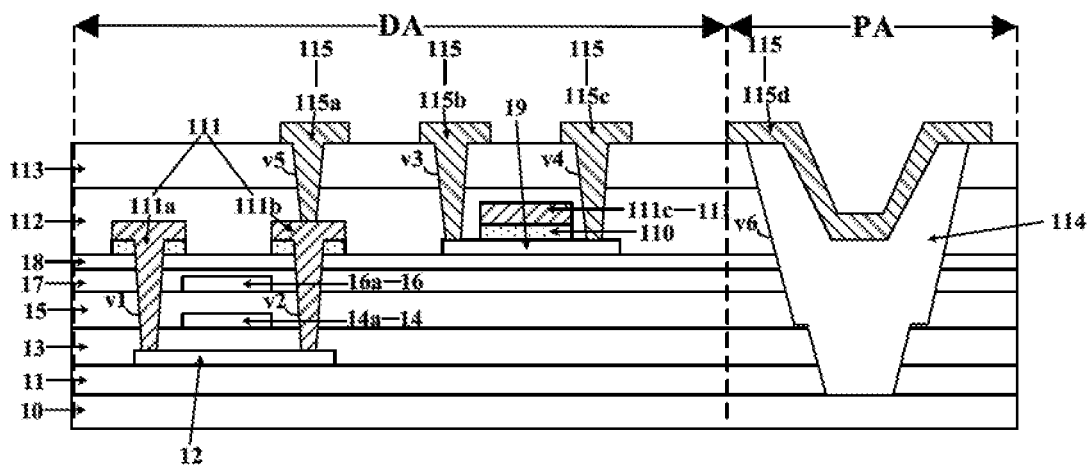
Figure 5Q:
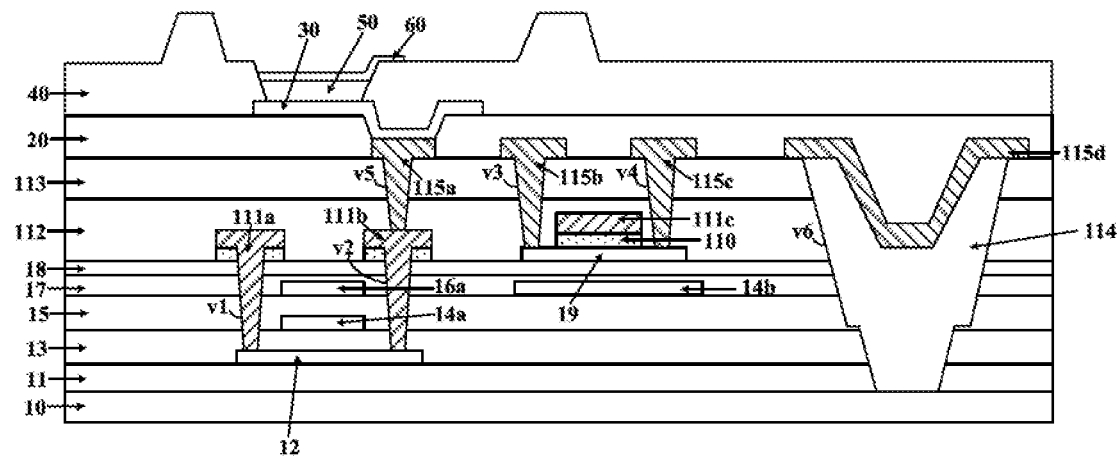

FIGS. 5A to 5Q illustrate a process of fabricating an army substrate in some embodiments according to the present disclosure. Referring to FIG. 5A, a first buffer layer 11 is formed on the base substrate 10, and a first active layer 12 is formed on a side of the first buffer layer distal to the base substrate 10. Various appropriate insulating materials and various appropriate fabricating methods may be used to make the first buffer layer 11. For example, an insulating material may be deposited on the substrate by a plasma-enhanced chemical vapor deposition (PECVD) process and patterned. Examples of appropriate insulating materials for making the first buffer layer 11 include, but are not limited to, silicon oxide (SiO$_x$), silicon nitride (SiN$_y$, e.g., Si$_3$N$_4$), silicon oxynitride (SiO$_x$N$_y$), and any combination thereof.

Various appropriate insulating materials and various appropriate fabricating methods may be used to make the first active layer 12. Optionally, the first active layer 12 is a polycrystalline silicon active layer. In one example, the method includes forming an amorphous silicon material layer on a side of the first buffer layer 11 distal to the base substrate 10, crystallizing the amorphous silicon material layer to form a polycrystalline silicon material layer, and patterning the polycrystalline silicon material layer into the first active layer 12. Optionally, the crystallizing step is performed by a laser annealing process to anneal the amorphous silicon material layer. Optionally, the laser annealing process is an excimer laser annealing (ELA) process.

Referring to FIG. 5B, a first gate insulating layer 13 is formed on a side of the first buffer layer 11 distal to the base substrate 10, and a first conductive layer 14 is formed on a side of the first gate insulating layer 13 distal to the base substrate 10. Various appropriate insulating materials and various appropriate fabricating methods may be used to make the first gate insulating layer 13. For example, an insulating material may be deposited on the substrate by a plasma-enhanced chemical vapor deposition (PECVD) process and patterned. Examples of appropriate insulating materials for making the first gate insulating layer 13 include, but are not limited to, silicon oxide (SiO$_x$), silicon nitride (SiN$_y$, e.g., Si$_3$N$_4$), silicon oxynitride (SiO$_x$N$_y$), and any combination thereof.

Various appropriate conductive materials and various appropriate fabricating methods may be used to make the first conductive layer 14. For example, a conductive material may be deposited on the substrate (e.g., by sputtering or vapor deposition); and patterned (e.g., by lithography such as a wet etching process) to form the first conductive layer 14. Examples of appropriate conductive materials for making the first conductive layer 14 include, but are not limited to, aluminum, tungsten, copper, and molybdenum, and alloys or laminates containing the same.

Optionally, the step of forming the first conductive layer 14 includes forming a first gate electrode 14a.

Optionally, and referring to FIG. 5C, the step of forming the first conductive layer 14 includes forming a first gate electrode 14a and a light shielding layer 14b. The first gate electrode 14a and the light shielding layer 14b are formed in a same layer in a single patterning process using a single mask plate. Optionally, the light shielding layer 14b and the second gate electrode of the second thin film transistor constitute a double-gate structure of the second thin film transistor.

Referring to FIG. 5D, an insulating layer 15 is formed on a side of the first gate electrode 14a distal to the base substrate 10, and a second conductive layer 16 is formed on a side of the insulating layer 15 distal to the first gate electrode 14a. Various appropriate insulating materials and various appropriate fabricating methods may be used to make the insulating layer 15. For example, an insulating material may be deposited on the substrate by a plasma-enhanced chemical vapor deposition (PECVD) process and patterned. Examples of appropriate insulating materials for making the insulating layer 15 include, but are not limited to, silicon oxide ($SiO_x$), silicon nitride ($SiN_y$, e.g., $Si_3N_4$), silicon oxynitride ($SiO_xN_y$), and any combination thereof.

Various appropriate conductive materials and various appropriate fabricating methods may be used to make the second conductive layer 16. For example, a conductive material may be deposited on the substrate (e.g., by sputtering or vapor deposition); and patterned (e.g., by lithography such as a wet etching process) to form the second conductive layer 16. Examples of appropriate conductive materials for making the second conductive layer 16 include, but am not limited to, aluminum, tungsten, copper, and molybdenum, and alloys or laminates containing the same.

Optionally, the step of forming the second conductive layer 16 includes forming a capacitor electrode 16a. The capacitor electrode 16a and the first gate electrode 14a constitute a storage capacitor in the first thin film transistor (to be formed). In the array substrate as shown in FIG. 5D and FIG. 3, the capacitor electrode 16a and the first gate electrode 14a of the storage capacitor are spaced apart by only the insulating layer 15. Optionally, the insulating layer 15 is formed to be in direct contact with the first capacitor electrode 16a and the first gate electrode 14a, and in direct contact with the first gate insulating layer 13 in regions outside the first gate electrode 14a. Optionally, the insulating layer 15 is formed to have a thickness in a range of approximately 100 nm to approximately 250 nm, e.g., approximately 100 nm to approximately 150 nm, approximately 150 nm to approximately 200 nm, and approximately 200 nm to approximately 250 nm.

As compared to the storage capacitor in the array substrate as shown in FIG. 1A and FIG. 1B, the storage capacitance of the storage capacitor formed between the capacitor electrode 16a and the first gate electrode 14a is much greater. In the storage capacitor in the array substrate as shown in FIG. 1A and FIG. 1B, the capacitor electrode 011a and the first gate electrode 05a are spaced apart by a plurality of layers including the second gate insulating layer 06, the first inter-layer dielectric layer 07, the second buffer layer 08, the third gate insulating layer 010. In the storage capacitor in the array substrate as shown in FIG. 5D and FIG. 3, the capacitor electrode 16a and the first gate electrode 14a of the storage capacitor are spaced apart by only a single layer, i.e., the insulating layer 15. Accordingly, in the array substrate as shown in FIG. 5D and FIG. 3, a much smaller area is required for the capacitor electrode 16a to achieve an equivalent storage capacitance, greatly enhancing the aperture ratio of the array substrate.

Optionally, and referring to FIG. 5E, the step of forming the second conductive layer 16 includes forming a capacitor electrode 16a and a light shielding layer 14b. The capacitor electrode 16a and the light shielding layer 14b are formed in a same layer in a single patterning process using a single mask plate.

Referring to FIG. 5F, a first inter-layer dielectric layer 17 on a side of the first capacitor electrode 16a distal to the base substrate 10, and a second buffer layer 18 is formed on a side of the first inter-layer dielectric layer 17 distal to the base substrate 10. Various appropriate insulating materials and various appropriate fabricating methods may be used to make the first inter-layer dielectric layer 17 and the second buffer layer 18. For example, an insulating material may be deposited on the substrate by a plasma-enhanced chemical vapor deposition (PECVD) process and patterned. Examples of appropriate insulating materials for making the first inter-layer dielectric layer 17 and the second buffer layer 18 include, but are not limited to, silicon oxide ($SiO_x$), silicon nitride ($SiN_y$, e.g., $Si_3N_4$), silicon oxynitride ($SiO_xN_y$), and any combination thereof.

Referring to FIG. 5G, a second active layer 19 is formed on a side of the second buffer layer 18 distal to the base substrate 10. Various appropriate semiconductor materials and various appropriate fabricating methods may be used to make the active layer. For example, a semiconductor material may be deposited on the substrate by a plasma-enhanced chemical vapor deposition (PECVD) process. Examples of appropriate semiconductor materials for making the second active layer 19 includes, but are not limited to, metal oxides (e.g., ITO, IZTO, IGTO), amorphous silicon, polycrystalline silicon, etc. Optionally, the second active layer 19 is a metal oxide active layer, e.g., an indium tin oxide active layer.

The second buffer layer 18 may be formed to have a single layer structure. Optionally, the second buffer layer 18 is formed to include a plurality of sublayers. Each sub-layer includes an insulating material such as silicon oxide ($SiO_x$), silicon nitride ($SiN_y$, e.g., $Si_3N_4$), and silicon oxynitride ($SiO_xN_y$). Optionally, at least a sub-layer of the second buffer layer 18 that is in direct contact with the second active layer 19 is made of $SiO_x$, $0<x \leq 2$, e.g., silicon dioxide. Optionally, the sub-layer of the second buffer layer 18 including $SiO_x$ and in direct contact with the second active layer 19 is formed to have a thickness greater than approximately 200 nm, e.g., greater than approximately 250 nm, greater than approximately 300 nm, and greater than approximately 350 nm.

Referring to FIG. 5H, a gate insulating material layer 10a is formed on a side of the second active layer 19 distal to the base substrate 10. Various appropriate insulating materials and various appropriate fabricating methods may be used to make the gate insulating material layer 110a. For example, an insulating material may be deposited on the substrate by a plasma-enhanced chemical vapor deposition (PECVD) process and patterned. Examples of appropriate insulating materials for making the gate insulating material layer 110a include, but are not limited to, silicon oxide ($SiO_x$), silicon nitride ($SiN_y$, e.g., $Si_3N_4$), silicon oxynitride ($SiO_xN_y$), and any combination thereof. Optionally, the gate insulating material layer 110a is made of $SiO_x$, $0<x \leq 2$. Optionally, the gate insulating material layer 110a is formed to have a thickness in a range of approximately 100 nm to approximately 250 nm.

Referring to FIG. 5I a first via v1 and a second via v2 are formed to respectively extend through the gate insulating material layer 110a, the second buffer layer 18, the first inter-layer dielectric layer 17, and the insulating layer 15, thereby exposing a source contact region and a drain contact region of the first active layer 12.

In forming an array substrate as shown in FIG. 1B, vias 001 are formed so that the first source-drain electrode 013a can be connected to the first active layer 03 and the second source-drain electrode 013b can be connected to the second active layer 09. The vias 001 are formed to extend through a second inter-layer dielectric layer 012, a second buffer layer 08, a first inter-layer dielectric layer 07, a second gate insulating layer 06, and a first gate insulating layer 04. The depth of vias 001 can reach as high as 140 nm, far beyond the limit that can be handled by a photoresist layer during a wet etching process. In forming the vias 001 in FIG. 1B, a combination of a wet etching process followed by a dry etching process is required to form the vias 001. Also, the vias 002 are formed prior to the vias 001. During the subsequent etching process for forming the vias 001, the etching agent (solution or gas) may damage the second active layer 09 exposed by the vias 002, leading to malfunction of the second thin film transistor.

In the process shown in FIG. 5I, the first via v1 and the second v2 are formed to respectively extend through the gate insulating material layer 110a, the second buffer layer 18, the first inter-layer dielectric layer 17, and the insulating layer 15. The depth of the first via v1 and the second via v2 is approximately 100 nm, much less than the vias 001 in FIG. 1B. Accordingly, a complicated etching process can be avoided in forming the first via v1 and the second via v2 in the process shown in FIG. 5I. During the etching process, the second active layer 19 is fully protected by the gate insulating material layer 110a that completely covers the second active layer 19. Thus, any damage caused by the etching agent (solution or gas) for forming the first via v1 and the second via v2 can be avoided by having the gate insulating material layer 110a, preventing malfunction of the second thin film transistor (to be formed).

Subsequent to forming the first via v1 and the second via v2, the method in some embodiments further includes cleaning the base substrate having the first via v1 and the second via v2. The cleaning step removes any residual oxidized silicon (e.g., oxidized polycrystalline silicon) on the surface of the first active layer exposed by the first via v1 and the second via v2. By having a cleaning step, the ohmic contact between the first active layer 12 and a first source electrode 111a to be formed, and the ohmic contact between the first active layer 12 and a first drain electrode 111b to be formed, can be greatly enhanced, ensuring a relatively high on-current in the first thin film transistor (to be formed). Optionally, the cleaning step is performed using a cleansing reagent such as hydrofluoric acid.

In forming an array substrate as shown in FIG. 1B, when the array substrate having the vias 001 are cleaned using a cleansing reagent such as hydrofluoric acid, because the vias 002 are formed prior to forming the vias 001, the second active layer 09 is etched by the cleansing reagent such as hydrofluoric acid, resulting in malfunction in the second thin film transistor.

In the process shown in FIG. 5I, the second active layer 19 is fully protected by the gate insulating material layer 110a that completely covers the second active layer 19. Thus, any damage caused by the cleansing reagent such as hydrofluoric acid during the cleaning step can be completely avoided. The gate insulating material layer 110a has a thickness sufficient to withstand the erosion caused by the cleansing reagent. Optionally, the gate insulating material layer 110a is formed to have a thickness in a range of approximately 100 nm to approximately 250 nm. In one example, a thickness eroded by the cleansing reagent such as hydrofluoric acid is approximately 50 nm. Thus, the gate insulating material layer 110a sufficiently protects the second active layer 19 during the cleaning step.

Subsequent to the cleaning step, in some embodiments, the gate insulating material layer 110a has a reduced thickness in a range of approximately 50 nm to approximately 200 nm, e.g., approximately 50 nm to approximately 100 nm, approximately 100 nm to approximately 150 nm, approximately 150 nm to approximately 200 nm.

Referring to FIG. 5J, subsequent to the cleaning step, a third conductive layer 111 is formed on a side of the gate insulating material layer 110a distal to the base substrate 10. Various appropriate conductive materials and various appropriate fabricating methods may be used to make the third conductive layer 111. For example, a conductive material may be deposited on the substrate (e.g., by sputtering or vapor deposition); and patterned (e.g., by lithography such as a wet etching process) to form the third conductive layer 111. Examples of appropriate conductive materials for making the third conductive layer 111 include, but are not limited to, titanium, aluminum, tungsten, copper, and molybdenum, and alloys or laminates containing the same. Optionally, the third conductive layer 111 includes a plurality of sublayers, e.g., a first sublayer of titanium, a second sublayer of aluminum, and a third sublayer of titanium, e.g., a Ti/Al/Ti layer.

Referring to FIG. 5J, the step of forming the third conductive layer 111 in some embodiments includes forming a first source electrode 111a, a first drain electrode 111b, and a second gate electrode 111c in a same layer in a single patterning step using a single mask plate, and using a same conductive material. The first source electrode 111a is formed to be electrically connected to the first active layer 12 through the first via v1. The first drain electrode 111b is formed to be electrically connected to the first active layer 12 through the second via v2.

Referring to FIG. 5K, subsequent to forming the first source electrode 111a, the first drain electrode 111b, and the second gate electrode 111c, the gate insulating material layer 110a is patterned to form a second gate insulating layer 110. Specifically, the gate insulating material layer 110a can be etched using an etchant, and using the third conductive layer 111 as a mask plate during the etching step. The gate insulating material layer 110a in regions not covered by the third conductive layer 111 (e.g., not covered by the first source electrode 111a, the first drain electrode 111b, or the second gate electrode 111c) is etched and removed, and the gate insulating material layer 110a in regions covered by the third conductive layer 111 remained, thereby forming the second gate insulating layer 110. Optionally, because the gate insulating material layer 110a has a thickness in a range of approximately 50 nm to approximately 200 nm, the etching step would not result in any significant lateral etching, nor would it adversely affect the third conductive layer 111 in any significant manner.

Referring to FIG. 5L, a second inter-layer dielectric layer 112 is formed on a side of the second gate electrode 111c, the second active layer 19, the first source electrode 111a, and the first drain electrode 111b distal to the base substrate 10. The second inter-layer dielectric layer 112 is formed to be in direct contact with a source electrode contact part and a drain electrode contact part of the second active layer 19.

Various appropriate insulating materials and various appropriate fabricating methods may be used to make the second inter-layer dielectric layer 112. For example, an insulating material may be deposited on the substrate by a plasma-enhanced chemical vapor deposition (PECVD) process and patterned. Examples of appropriate insulating materials for making the second inter-layer dielectric layer 112 include, but are not limited to, silicon oxide ($SiO_x$), silicon nitride ($SiN_y$, e.g., $Si_3N_4$), silicon oxynitride ($SiO_xN_y$), and any combination thereof.

The second inter-layer dielectric layer 112 may be formed to have a single layer structure. Optionally, the second inter-layer dielectric layer 112 is formed to include a plurality of sublayers. Each sub-layer includes an insulating material such as silicon oxide ($SiO_x$), silicon nitride ($SiN_y$, e.g., $Si_3N_4$), and silicon oxynitride ($SiO_xN_y$). Optionally, at least a sub-layer of the second inter-layer dielectric layer 112 that is in direct contact with the source electrode contact part and the drain electrode contact part of the second active layer 19 is made of $SiO_x$ $0<x\leq 2$, e.g., silicon dioxide. Optionally, the sub-layer of the second inter-layer dielectric layer 112 including $SiO_x$ and in direct contact with the source electrode contact part and the drain electrode contact part of the second active layer 19 is formed to have a thickness greater than approximately 200 nm, e.g., greater than approximately 250 nm, greater than approximately 300 nm, and greater than approximately 350 nm.

Referring to FIG. 5L, a passivation layer 113 is then formed on a side of the second inter-layer dielectric layer 112 distal to the base substrate 10. Various appropriate insulating materials and various appropriate fabricating methods may be used to make the passivation layer 113. For example, an insulating material may be deposited on the substrate by a plasma-enhanced chemical vapor deposition (PECVD) process and patterned. Examples of appropriate insulating materials for making the passivation layer 113 include, but are not limited to, silicon oxide ($SiO_x$), silicon nitride ($SiN_y$, e.g., $Si_3N_4$), silicon oxynitride (SiOxNy), and any combination thereof. Optionally, the passivation layer 113 is formed to have a thickness greater than approximately 200 nm, e.g., greater than approximately 250 nm, greater than approximately 300 nm, and greater than approximately 350 nm.

Referring to FIG. 5M, a sixth via v6 is formed in a peripheral area PA of the array substrate. The sixth via v6 is formed to extend at least one layer of the array substrate. Referring to FIG. 5M, the sixth via v6 is formed to extend through the passivation layer 113, the second inter-layer dielectric layer 112, the second buffer layer 18, the first inter-layer dielectric layer 17, the insulating layer 15, the first gate insulating layer 13, and the first buffer layer 11 in the peripheral area PA. Because the sixth via v6 has a relatively large depth, optionally, the sixth via v6 is formed by two separate etching steps.

Referring to FIG. 5N, an organic filler layer 114 for enhancing flexibility in the peripheral area PA is formed in the peripheral area PA. Optionally, the organic filler layer 114 is limited to the peripheral area PA, and does not extend into the display area DA. Various appropriate filler materials and various appropriate fabricating methods may be used to make the organic filler layer 114. For example, a filler material may be deposited on the substrate by coating and subsequently patterned. Examples of appropriate insulating materials for making the organic filler layer 114 include, but are not limited to, acrylic resins and epoxy resins.

Referring to FIG. 5O, the method in some embodiments further includes forming a third via v3, a fourth via v4, and a fifth via v5, respectively extending through the passivation layer 113 and the second inter-layer dielectric layer 112, in a single patterning step.

Referring to FIG. 5P, a fourth conductive layer 115 is then formed on a side of the passivation layer 113 distal to the base substrate 10. Various appropriate conductive materials and various appropriate fabricating methods may be used to make the fourth conductive layer 115. For example, a conductive material may be deposited on the substrate (e.g., by sputtering or vapor deposition); and patterned (e.g., by lithography such as a wet etching process) to form the fourth conductive layer 115. Examples of appropriate conductive materials for making the fourth conductive layer 115 include, but are not limited to, titanium, aluminum, tungsten, copper, and molybdenum, and alloys or laminates containing the same. Optionally, the fourth conductive layer 115 includes a plurality of sublayers, e.g., a first sublayer of titanium, a second sublayer of aluminum, and a third sublayer of titanium, e.g., a Ti/Al/Ti layer.

Referring to FIG. 5P, the step of forming the fourth conductive layer 115 in some embodiments includes forming a relay electrode 115a, a second source electrode 115b, and a second drain electrode 115c in a same layer in a single patterning process using a single mask plate, and optionally using a same material. Optionally, the step of forming the fourth conductive layer 115 in some embodiments includes forming a relay electrode 115a, a second source electrode 115b, a second drain electrode 115c, and a signal line 115d in a same layer in a single patterning process using a single mask plate, and optionally using a same material. The signal line 115 d is formed in the peripheral area PA; and the relay electrode 115a, the second source electrode 115b, and the second drain electrode 115c are formed in the display area DA. The relay electrode 115a is formed to be electrically connected to the first drain electrode 111b through the fifth via v5. The second source electrode 15b is formed to be electrically connected to the second active layer 19 through the third via v3. The second drain electrode 115c is formed to be electrically connected to the second active layer 19 through the fourth via v4. The signal line 115d is formed on a side of the organic filler layer 114 distal to the base substrate 10.

Referring to FIG. 1A, typically the relay electrode 016 is formed using a dry etching process, and typically the relay electrode 016 has a Ti/A/Ti triple-layer structure. Accordingly, subsequent to the dry etching process, to prevent erosion of aluminum by any residual chloride on the surface of the relay electrode 016, it is typically required to have a cleaning step using a gaseous mixture including, for example, carbon tetrafluoride, sulfur hexafluoride, and oxygen, to replace any residual chloride. However, the gaseous mixture can erode the planarization layer 015 in the array substrate as shown in FIG. 1A, which is typically made of an organic material. To avoid the erosion of the planarization layer 015, the dry etching equipment for etching the relay electrode has to be modify.

Referring to FIG. 5P, the passivation layer 113 is an inorganic layer. The organic filler layer 114 is limited to the peripheral area PA, and does not extend to the display area DA. Thus, when the cleaning step using a gaseous mixture is performed on the relay electrode 115, the passivation layer 113 (which is made of an inorganic material) would not be adversely affected by the gaseous mixture, further simplifying the fabrication process.

Up to the steps described in FIG. 5P, only a total of eleven patterning steps have been performed. Specifically, the eleven patterning steps include forming the first active layer 12; forming the first conductive layer 14, forming the second conductive layer 16, forming the second active layer 19, forming the sixth via v6, forming the third conductive layer 111, forming the first via v1 and the second via v2, forming the organic filler layer 114, forming the third via v3, the fourth via v4, and the fifth via v5, and forming the fourth conductive layer 115. Optionally, forming the sixth via v6 includes two separate patterning steps. Thus, the method described in FIGS. 5A to 5P does not require more patterning steps that those required for fabricating an array substrate as shown in FIG. 1A.

The present method fabricates an array substrate that provides several advantages over the array substrate fabricated by other methods, e.g., over the array substrate as shown in FIG. 1A. First, in the array substrate fabricated by the present method, the storage capacitance of the storage capacitor formed between the capacitor electrode 16a and the first gate electrode 14a is much greater. Accordingly, a smaller area is required for the capacitor electrode 16a to achieve an equivalent storage capacitance, greatly enhancing the aperture ratio of the array substrate. Second, forming the vias connecting the first active layer 12 to the first source electrode 111a and the first drain electrode 111b, respectively, is much easier in the present method. The first via v1 and the second via v2 need to extend a much smaller depth as compared to that in the other methods, e.g., the method described in FIG. 1B. Third, the present method includes forming a gate insulating material layer 110a that completely covers the second active layer 19 during the etching process of the first via v1 and the second via v2, any damage that may be caused by the etching agent for forming the first via v1 and the second via v2 can be avoided, preventing malfunction of the second thin film transistor. Fourth, in the present method, because gate insulating material layer 110a has a thickness sufficient to withstand the erosion caused by a cleansing reagent used in a cleaning step subsequent to forming the first via v1 and the second via v2, the second active layer 19 can be sufficiently protected during the cleaning step. Moreover, the present method limits the organic filer layer 114 in the peripheral area, and the passivation layer 113 is made of an inorganic material. Any erosion of organic layer caused by a cleaning step for cleaning the relay electrode 115a can be obviated in the present method. There is also no need to modify dry etching equipment for etching the relay electrode 115a.

Referring to FIG. 5Q, a planarization layer 20 is formed on a side of the relay electrode 115a, the second source electrode 115b, the second drain electrode 115c, and the signal line layer 115d distal to the base substrate 10. Subsequently a first electrode 30 is formed on a side of the planarization layer 20 distal to the base substrate 10, the first electrode 30 is formed to be electrically connected to the relay electrode 115a. A pixel definition layer 40 is formed to define a pixel aperture. A light emitting layer 50 is formed in the pixel aperture. A second electrode 60 is formed on a side of the light emitting layer 50 distal to the first electrode 30, thereby forming a light emitting element including the first electrode 30, the light emitting layer 50, and the second electrode 60.

In another aspect, the present disclosure provides a display panel including an array substrate described herein or fabricated by a method described herein, and a counter substrate facing the array substrate. In some embodiments, the light emitting element is an organic light emitting diode, and the display panel is an organic light emitting diode display panel. In some embodiments, the light emitting element is a quantum dots light emitting diode, and the display panel is a quantum dots light emitting diode display panel. In some embodiments, the light emitting element is a micro light emitting diode, and the display panel is a micro light emitting diode display panel.

In another aspect, the present disclosure provides a display apparatus including a display panel described herein. The display apparatus further includes one or more integrated circuits electrically connected to the signal lines in the peripheral area of the array substrate. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a base substrate;
   a first thin film transistor on the base substrate and comprising a first active layer, a first gate electrode, a first source electrode and a first drain electrode, the first active layer being a silicon active layer;
   a second thin film transistor on the base substrate and comprising a second active layer, a second gate electrode, a second source electrode and a second drain electrode, the second active layer being a metal oxide active layer;
   a first gate insulating layer between the first active layer and the first gate electrode;
   a second gate insulating layer between the second active layer and the second gate electrode, the second gate insulating layer being different from the first gate insulating layer;

an insulating layer on a side of the first gate electrode distal to the base substrate;
a capacitor electrode on a side of the insulating layer distal to the first gate electrode; and
a buffer layer on a side of the capacitor electrode distal to the base substrate;
wherein the first source electrode, the first drain electrode, and the second gate electrode are in a same layer;
the first source electrode and the first drain electrode are on a side of the second gate insulating layer distal to the base substrate;
the capacitor electrode and the first gate electrode constitute a storage capacitor in the first thin film transistor;
the buffer layer is in direct contact with the second active layer; and
at least a sub-layer of the buffer layer that is in direct contact with the second active layer comprises $SiO_x$, $0<x<2$.

2. The array substrate of claim 1, wherein the second gate insulating layer is in direct contact with the first source electrode and the first drain electrode.

3. The array substrate of claim 1, wherein the insulating layer is in direct contact with the capacitor electrode and the first gate electrode; and
the insulating layer has a thickness in a range of approximately 100 nm to approximately 250 nm.

4. The array substrate of claim 1, further comprising a first inter-layer dielectric layer on a side of the capacitor electrode distal to the base substrate; and
a buffer layer on a side of the first inter-layer dielectric layer distal to the base substrate.

5. The array substrate of claim 1, wherein the sub-layer of the buffer layer comprising $SiO_x$ and in direct contact with the second active layer has a thickness greater than approximately 200 nm.

6. An array substrate, comprising:
a base substrate;
a first thin film transistor on the base substrate and comprising a first active layer, a first gate electrode, a first source electrode and a first drain electrode, the first active layer being a silicon active layer;
a second thin film transistor on the base substrate and comprising a second active layer, a second gate electrode, a second source electrode and a second drain electrode, the second active layer being a metal oxide active layer;
a first gate insulating layer between the first active layer and the first gate electrode:
a second gate insulating layer between the second active layer and the second gate electrode, the second gate insulating layer being different from the first gate insulating layer;
an insulating layer on a side of the first gate electrode distal to the base substrate;
a first inter-layer dielectric layer on a side of the insulating layer distal to the base substrate;
a buffer layer on a side of the first inter-layer dielectric layer distal to the base substrate; and
a first via and a second via respectively extending through the second gate insulating layer, the buffer layer, the first inter-layer dielectric layer, and the insulating layer;
wherein the first source electrode, the first drain electrode, and the second gate electrode are in a same layer;
the first source electrode and the first drain electrode are on a side of the second gate insulating layer distal to the base substrate;
the first source electrode is electrically connected to the first active layer through the first via; and
the first drain electrode is electrically connected to the first active layer through the second via.

7. An array substrate, comprising:
a base substrate;
a first thin film transistor on the base substrate and comprising a first active layer, a first gate electrode, a first source electrode and a first drain electrode, the first active layer being a silicon active layer;
a second thin film transistor on the base substrate and comprising a second active layer, a second gate electrode, a second source electrode and a second drain electrode, the second active layer being a metal oxide active layer;
a first gate insulating layer between the first active layer and the first gate electrode:
a second gate insulating layer between the second active layer and the second gate electrode, the second gate insulating layer being different from the first gate insulating layer; and
a second inter-layer dielectric layer on a side of the second gate electrode, the second active layer, the first source electrode, and the first drain electrode distal to the base substrate;
wherein the first source electrode, the first drain electrode, and the second gate electrode are in a same layer;
the first source electrode and the first drain electrode are on a side of the second gate insulating layer distal to the base substrate;
the second inter-layer dielectric layer is in direct contact with a source electrode contact part and a drain electrode contact part of the second active layer; and
at least a sub-layer of the second inter-layer dielectric layer that is in direct contact with the source electrode contact part and the drain electrode contact part of the second active layer comprises $SiO_x$, $0<x<2$.

8. The array substrate of claim 7, wherein the sub-layer of the second inter-layer dielectric layer comprising $SiO_x$ and in direct contact with the source electrode contact part and the drain electrode contact part of the second active layer has a thickness greater than approximately 200 nm.

9. The array substrate of claim 7, further comprising a passivation layer on a side of the second inter-layer dielectric layer distal to the base substrate; and
a third via and a fourth via respectively extending through the passivation layer and the second inter-layer dielectric layer;
wherein the second source electrode is electrically connected to the second active layer through the third via; and
the second drain electrode is electrically connected to the second active layer through the fourth via.

10. The array substrate of claim 9, further comprising:
a relay electrode electrically connected to the first drain electrode; and
a fifth via extending through the passivation layer and the second inter-layer dielectric layer;
wherein the relay electrode, the second source electrode, and the second drain electrode are in a same layer, and on a side of the passivation layer distal to the base substrate; and
the relay electrode is electrically connected to the first drain electrode through the fifth via.

11. The array substrate of claim 10, wherein the array substrate has a display area and a peripheral area; and the first thin film transistor and the second thin film transistor are in the display area;

wherein the array substrate in the peripheral area further comprises:

a signal line layer;

a sixth via extending through at least one layer of the array substrate; and an organic filler layer filling the sixth via for enhancing flexibility in the peripheral area;

wherein the signal line layer is in a same layer as the relay electrode, the second source electrode, and the second drain electrode; and the signal line layer is on a side of the organic filler layer distal to the base substrate.

12. The array substrate of claim 1, further comprising a light shielding layer configured to shield light from irradiating on the second active layer;

wherein the light shielding layer is in a same layer as one of the capacitor electrode and the first gate electrode.

13. The array substrate of claim 12, wherein the light shielding layer and the second gate electrode constitute a double-gate structure of the second thin film transistor.

14. The array substrate of claim 2, wherein the second gate insulating layer comprises $SiO_x$, $0<x<2$.

15. A display apparatus, comprising the array substrate of claim 1.

16. A display apparatus, comprising the array substrate of claim 6.

17. A display apparatus, comprising the array substrate of claim 7.

* * * * *